United States Patent
Chao et al.

(10) Patent No.: US 7,626,191 B2
(45) Date of Patent: Dec. 1, 2009

(54) LATERAL PHASE CHANGE MEMORY WITH SPACER ELECTRODES

(75) Inventors: Te-Sheng Chao, Hsinchu (TW); Wen-Han Wang, Hsinchu (TW); Min-Hung Lee, Hsinchu (TW); Hong-Hui Hsu, Hsinchu (TW); Chien-Min Lee, Hsinchu (TW); Yen Chuo, Hsinchu (TW); Yi-Chan Chen, Hsinchu (TW); Wei-Su Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 51 days.

(21) Appl. No.: 11/435,276

(22) Filed: May 17, 2006

(65) Prior Publication Data

US 2007/0120105 A1 May 31, 2007

(30) Foreign Application Priority Data

Nov. 30, 2005 (TW) .............................. 94142136 A

(51) Int. Cl.
*H01L 29/02* (2006.01)
(52) U.S. Cl. .......................................... 257/3; 438/102
(58) Field of Classification Search ................ 257/2–4, 257/53, 252, 263, 265, 302, 324, 337, 343, 257/414, 467, 499, 528, 536, 537, 539, 613, 257/629, 632, 635, 773, E29.17, E31.001, 257/E31.029, E45.002; 438/54, 84, 85, 95, 438/98, 102, 103, 197
See application file for complete search history.

(56) References Cited

U.S. PATENT DOCUMENTS

| 6,545,287 | B2 * | 4/2003 | Chiang | 257/3 |
| 6,635,951 | B1 * | 10/2003 | Zahorik | 257/613 |
| 6,744,088 | B1 * | 6/2004 | Dennison | 257/296 |
| 6,867,425 | B2 * | 3/2005 | Wicker | 257/3 |
| 7,135,696 | B2 * | 11/2006 | Karpov et al. | 257/2 |
| 7,173,271 | B2 * | 2/2007 | Chang | 257/2 |
| 7,314,776 | B2 * | 1/2008 | Johnson et al. | 438/95 |
| 2004/0166604 | A1 | 8/2004 | Ha et al. | |

(Continued)

FOREIGN PATENT DOCUMENTS

CN 1536688 A 10/2004

(Continued)

OTHER PUBLICATIONS

Harper, C. Electronics Materials and Processes Handbook, New York: McGraw-Hill, 3rd Edition, 2004, Chapter 3.*

(Continued)

*Primary Examiner*—Steven Loke
*Assistant Examiner*—Suberr Chi
(74) *Attorney, Agent, or Firm*—Rabin & Berdo, P.C.

(57) ABSTRACT

A lateral phase change memory with spacer electrodes and method of manufacturing the same are provided. The memory is formed by connecting the conductive electrodes with lower resistivity and the spacer electrodes with higher resistivity, and filling the phase change material between the spacer electrodes. Therefore, the area that the phase change material contacts the spacer electrodes and the volume of the phase change material can be reduced; thereby the programming current and power consumption of the phase change memory are reduced.

8 Claims, 8 Drawing Sheets

U.S. PATENT DOCUMENTS

2005/0062132 A1* 3/2005 Klersy et al. ............... 257/536
2006/0091492 A1* 5/2006 Lee et al. .................. 257/467
2007/0040159 A1* 2/2007 Wang ......................... 257/3

FOREIGN PATENT DOCUMENTS

| CN | 1564337 A | | 1/2005 |
|---|---|---|---|
| WO | WO2007110815 | * | 10/2007 |
| WO | WO2008002017 | * | 3/2008 |

OTHER PUBLICATIONS

Lankhorst, M. et al, Nature Materials Research, Mar. 2005, pp. 347-352.*
Lacaita, A.L., "Phase change memories: State of the art, challenges, and perspectives", 2006, Solid State Electronics, (50), pp. 24-31.*
Ha et al., An edge contact type cell for phase change RAM featruing very low power consumption, 2003 Symposium on VLSI Technology Digest of Technical Papers.

* cited by examiner

LATERAL PHASE CHANGE MEMORY WITH SPACER ELECTRODES

CROSS-REFERENCE TO RELATED APPLICATIONS

This non-provisional application claims priority under 35 U.S.C. § 119(a) on Patent Application No. 094142136 filed in Taiwan, R.O.C. on Nov. 30, 2005, the entire contents of which are hereby incorporated by reference.

BACKGROUND OF THE INVENTION

1. Field of Invention

The present invention relates to a phase change memory, and more particularly to a lateral phase change memory with spacer electrodes and method of manufacturing the same, wherein the phase change memory has electrodes with a smaller contact area formed therein, so as to reduce the required programming current for the phase change.

2. Related Art

Many different materials have two or more states, and materials with two states are particularly suitable for being used in digital memory. The state of the chalcogenide materials can be changed in a thermal inductive way as the temperature changes, so as to be in an amorphous state or a crystalline state.

Basically, when the chalcogenide material is in the amorphous state, i.e., an irregularly arranged atomic lattice, it has a higher resistivity; and when the chalcogenide material is in the crystalline state, i.e., a regularly arranged atomic lattice, it has a lower resistivity. The amorphous state, also referred as the reset state, can represent logic 1; whereas the crystalline state, also referred as the set state, represents logic 0. Moreover, the structural state of chalcogenide material can stably exist in an environment with a temperature below the glass transition temperature; therefore, the phase change memory element can be considered as a non-volatile programmable resistor, which can be reversibly and alternately changed between high resistance and low resistance.

The phase change of chalcogenide material is rapid and reversible, and the resistance difference between the amorphous state and crystalline state caused by phase change is significant; therefore, the chalcogenide material is particularly suitable for being used as the material of the phase change memory. In general, the phase transition of chalcogenide material from the amorphous state to the crystalline state can be finished in nanoseconds, and the difference between the corresponding high resistance and low resistance can be higher than six orders of magnitude.

The structure of chalcogenide material changed as the temperature changes in the phase change memory is determined by the current level which passes through the heating electrode and causes the ohmic heating effect, wherein the heating electrode is adjacently connected to the body of the chalcogenide material. The heating electrode is mainly formed by a conductive material with higher resistivity, and the current density can be increased by reducing the contact area between the heating electrode and the chalcogenide material. Therefore, the heating efficiency can be increased and the programming current can be reduced. The operation of phase change memory element can be accomplished by applying two different programming pulses to heat the localized phase change material to an elevated temperature. Depending upon the elevated temperature the material is melted to form either the amorphous state or the crystalline state by modifying the amplitude and duration of the programming pulses, i.e., so-called reset operation and set operation, respectively. The programmed states of phase change memory can be memorized by reading the resistance difference between these two states.

Generally, the memory cell design of the conventional phase change memory array employs 1T1R architecture; that is, the phase change memory element is connected with the steering transistor in series, wherein the phase change memory element is stacked on the transistor and connected with the drain of the transistor. The process of the phase change memory element is compatible with existing CMOS standard processes, and is primarily added to the back-end process. The steering transistor can be used as the cell selector while reading and programming the phase change memory element, and the current required to program the phase change memory element must also flow through it. So, the size of the transistor should be large enough to support the programming current of phase change memory, and its size also dominates the area of the memory cell in the phase change memory unit. Therefore, the density of the phase change memory can be efficiently increased by reducing the programming current of the phase change memory, which also has become the biggest challenge for the development of the phase change memory technology.

Further, the MOSFET transistor is the most common steering device in the phase change memory technology. The area of the phase change memory unit is mainly limited by the area of the MOSFET transistor, such that in order to increase the density of the phase change memory, the programming current should be reduced so as to reduce the size of the MOSFET transistor. The programming current can be reduced by enhancing the heating efficiency of the electrode, and the heating efficiency of the electrode can be enhanced generally by two ways. One way is reducing the contact area between the heating electrode and the phase change material, thus the current density can be increased; the other is using a heating electrode material with higher resistivity to further enhance the ohmic heating efficiency.

For example, the phase change memory technology issued in Symposium on VLSI Technology 2003 in the year of 2003 discloses a phase change memory formed through the edge contact process, wherein the contact area between the phase change memory and the heating electrode can be controlled by the thickness of the deposited heating electrode. Compared with the conventional structure in which the contact area is limited by the ability of the lithography process, this method can obtain a tremendous breakthrough for reducing the contact area.

However, the heating electrode in the disclosed edge contact phase change memory cell is located in the sandwiching layer of the side walls of the trench. This may result in the gap-filling and sidewall-contacting difficulty of the phase change material as well as the problems of uniformity and reliability. Further, the current flowing path of the heating electrode with higher resistivity in the phase change memory is relatively long, and the phase change material occupies an excessively large volume in the element; thus, when the current flows form the lateral heating electrode to the upper electrode, more power will be consumed.

In addition, a lateral phase change memory and method therefor are disclosed in U.S. Pat. No. 6,867,425 in Mar. 15, 2005, wherein an electrode material is formed on a substrate and then patterned, and the patterned electrodes are used as the two electrodes on the phase change material through which the current is flowing. The benefit is that the electrode contact area can be reduced by the lateral contact so as to reduce the programming current, and the path for the current to flow through the phase change material can be reduced by shortening the distance between the two electrodes, thereby reducing the power consumption of the element during operation. Generally, to increase the heating efficiency of the phase change material, a heating electrode material with higher resistivity is required to be used in the phase change memory element, and if the heating electrode is also used as a conductive path in the design, the parasitic resistance will be increased resulting in additional power consumption. Further, when the distance between the two electrodes has been gradually reduced, it will be more and more difficult for the gap filling of phase change material, thereby resulting in poor interface contact between the lateral electrode and the phase change material, and problems of uniformity and reliability of the element.

Accordingly, it is necessary to provide a phase change memory with smaller contact area, lower programming current, and lower power consumption, to overcome the drawbacks of the conventional art.

SUMMARY OF THE INVENTION

In view of the above problem, a lateral phase change memory with spacer electrodes and method of manufacturing the same are provided, wherein the spacer electrodes are added at the position of the conductive electrode of the phase change memory acting as heating electrodes, so as to increase the heating efficiency and to reduce the parasitic resistance of the conductive path. The contact area is also reduced by contacting the spacer electrodes with the phase change material laterally. So, the programming current and power consumption of the phase change memory can be reduced. Moreover, with the addition of the spacer electrodes, the gap-filling ability of the phase change material can be improved, and the interface contact quality of the phase change material with the heating electrodes is better as well.

The method for manufacturing the lateral phase change memory with spacer electrodes disclosed in the present invention includes the following steps: forming a first insulating dielectric layer; forming a first non-phase change material layer on the first insulating dielectric layer, wherein the first non-phase change material layer includes a channel passing there-through; forming the second non-phase change material layer on both side walls of the channel of the first non-phase change material layer, wherein the resistivity of the second non-phase change material layer is higher than that of the first non-phase change material layer; forming a phase change material layer between the second non-phase change material layer; forming a second insulating dielectric layer on the first non-phase change material layer, the second non-phase change material layer, and the phase change material layer, wherein the second insulating dielectric layer includes a channel passing there-through; and forming an electric plug in the channel of the second insulating dielectric layer.

Additionally, another method for manufacturing the lateral phase change memory with spacer electrodes includes the following steps: forming a semiconductor element; forming an insulating dielectric layer on the semiconductor element, and the insulating dielectric layer includes a plurality of metallic plugs passing there-through; forming a grounding pad and an electric pad on the metallic plugs; forming a first insulating dielectric layer on the grounding pad, the electric pad, and the insulating dielectric layer, wherein the first insulating dielectric layer includes a metallic plug connected to the electric pad and passing through the first insulating dielectric layer; forming a first non-phase change material layer on the first insulating dielectric layer, wherein the first non-phase change material layer includes a channel passing there-through; forming a second non-phase change material layer on both side walls of the channel of the first non-phase change material layer, wherein the resistivity of the second non-phase change material layer is higher than that of the first non-phase change material layer; forming a phase change material layer between the second non-phase change material layer; forming a second insulating dielectric layer on the first non-phase change material layer, the second non-phase change material layer, and the phase change material layer, wherein the second insulating dielectric layer includes a channel passing there-through; and forming a contact plug in the channel of the second insulating dielectric layer.

The lateral phase change memory with spacer electrodes disclosed in the present invention includes: a first insulating dielectric layer, a first non-phase change material layer, the second non-phase change material layer, a phase change material layer, a second insulating dielectric layer, and an electric plug. The first non-phase change material layer is formed on the first insulating dielectric layer, and includes a channel passing there-through. The second non-phase change material layer is formed on both side walls of the channel of the first non-phase change material layer, wherein the resistivity of the second non-phase change material layer is higher than that of the first non-phase change material layer.

The phase change material layer is filled between the side walls of the second non-phase change material layer. The second insulating dielectric layer is formed on the first non-phase change material layer, the second non-phase change material layer, and the phase change material layer, and includes a channel passing there-through. Finally, the electric plug is formed in the channel of the second insulating dielectric layer.

Additionally, another lateral phase change memory with spacer electrodes disclosed in the present invention includes: a semiconductor element, an insulating dielectric material layer, a grounding pad, an electric pad, a first insulating dielectric layer, a first non-phase change material layer, the second non-phase change material layer, a phase change material layer, a second insulating dielectric layer, and an electric plug. The insulating dielectric material layer is formed on the semiconductor element, and includes several metallic plugs passing there-through. The grounding pad and the electric pad are connected to the metallic plugs respectively. The first insulating dielectric layer is formed on the insulating dielectric material layer, the grounding pad, and the electric pad, and includes a metallic plug connected to the electric pad and passing through the first insulating dielectric layer. The first non-phase change material layer is formed on the first insulating dielectric layer, and includes a channel passing there-through. The second non-phase change material layer is formed on both side walls of the channel of the first non-phase change material layer, wherein the resistivity of the second non-phase change material layer is higher than that of the first non-phase change material layer.

The phase change material layer is filled between the side walls of the second non-phase change material layer. The second insulating dielectric layer is formed on the first non-phase change material layer, the second non-phase change material layer, and the phase change material layer, and includes a channel passing there-through. Finally, the electric plug is formed in the channel of the second insulating dielectric layer.

The detailed features and advantages of the present invention will be described in detail in the following detailed description, and the content is sufficient for any of those skilled in the art to appreciate the technical content of the present invention and implement accordingly. And any of those skilled in the art can easily understand the related objects and advantages of the present invention according to the disclosure of the present specification, claims, and accompanying drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only for, and thus are not limitative of the present invention, and wherein.

DETAILED DESCRIPTION OF THE INVENTION

In the conventional phase change memory, a conductive material and a phase change material layer 40 are stacked with each other, wherein the phase change material layer 40 is parallel to the surface of the substrate, and one or more channels pass through an insulating layer, for exposing the conductive material. And then, the electrically contacting area between the conductive material and the phase change material layer 40 is determined by the area of the channel, and the surface of the contact area is parallel to that of the substrate. The minimum area of the channel, i.e., the minimum contact area, is mainly determined by the lithography process, and the area of the channel will determine the required programming current vertically flowing into the phase change material layer 40, i.e., determine the amount of current for setting or resetting the phase change memory. Therefore, in the conventional method, the programming current of the phase change memory is mainly limited by the ability of the lithography process. However, in the phase change memory of the present invention, spacer electrodes are added as the conductive material of the phase change memory for enhancing the heating efficiency; and meanwhile, the lateral contact of the heating electrodes is used to reduce the electrode contact area of the phase change memory, thereby the programming current and power consumption of the phase change memory can be reduced. Therefore, the contact area of the phase change memory of the present invention can be controlled by the deposited thickness of the electrode, which is not limited by the ability of the lithography process.

The lateral phase change memory with spacer electrodes and method of manufacturing the same provided in the present invention are illustrated with the phase change memory itself and illustrated with the phase change memory and the transistor (e.g. MOSFET, BJT, and the like) on the same substrate, and the present invention is suitable for other types of memories. The above memory refers to the memory itself and the memory unit related to a transistor or other control elements.

Figure 1A:
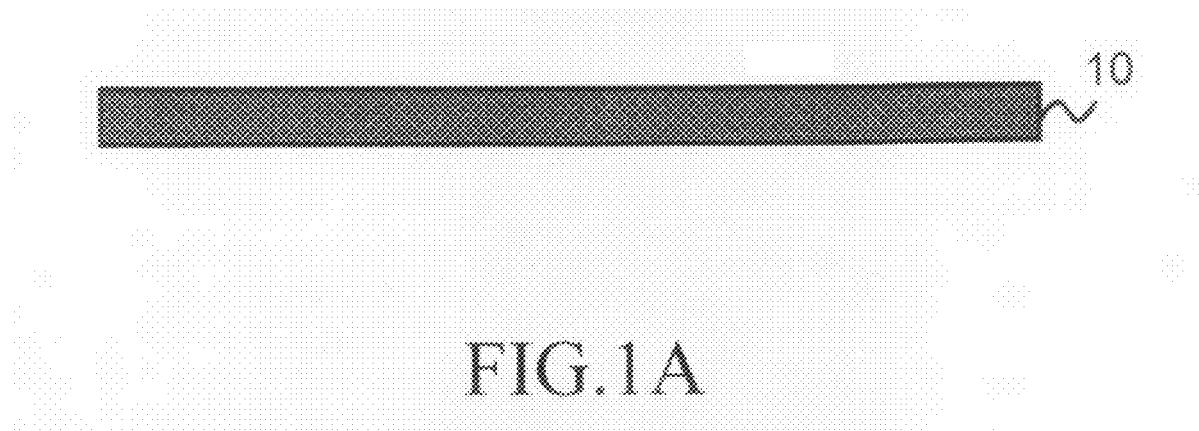
FIG. 1A, FIG. 1B, FIG. 1C, FIG. 1D, FIG. 1E, and FIG. 1F are cross-sectional views of a lateral phase change memory with spacer electrodes and method of manufacturing the same according to a first embodiment of the present invention.

Referring to FIG. 1A, FIG. 1B, FIG. 1C, FIG. 1D, FIG. 1E, and FIG. 1F, they are cross-sectional views of a lateral phase change memory with spacer electrodes and method of manufacturing the same according to a first embodiment of the present invention. First, a silicon oxide material is deposited through the conventional Chemical Vapor Deposition (CVD) or Physical Vapor Deposition (PVD) process to form a first insulating dielectric layer 10, as shown in FIG. 1A.

The above first insulating dielectric layer 10 can be formed by various dielectric materials, including silicon oxide materials, silicon nitride materials, low dielectric constant materials, and fluorine doped glass materials (e.g. fluorine doped glass (FSG)) formed through the process, such as plasma enhanced chemical vapor deposition (PECVD), plasma enhanced tetraethylorthosilicate (PETEOS), borophosphorus doped tetraethylorthosilicate (BPTEOS), boron doped tetraethylorthosilicate (BTEOS), phosphorous doped tetraethylorthosilicate (PTEOS), tetraethylorthosilicate (TEOS), plasma enhanced oxide (PEOX), etc.

Figure 1B:
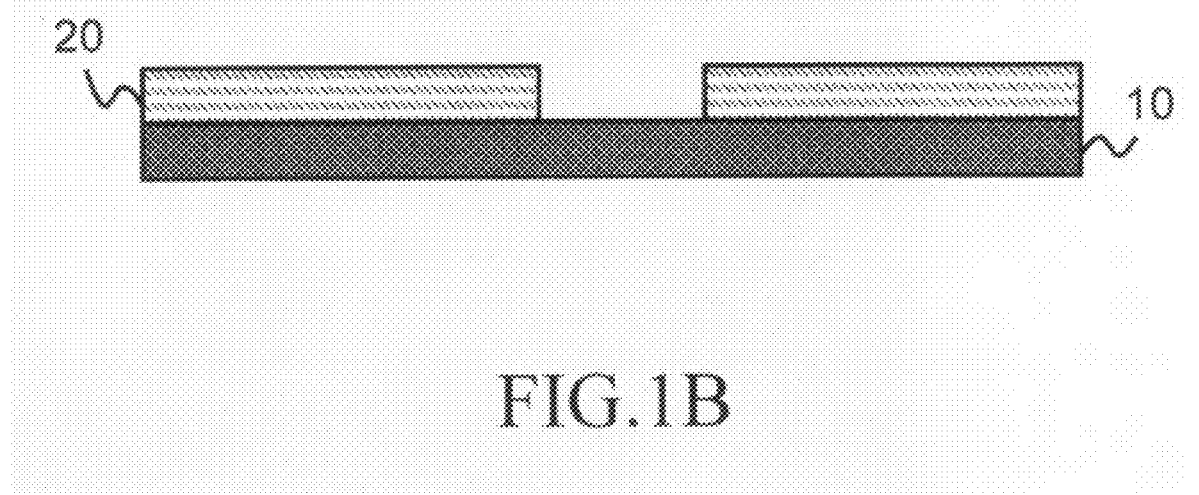

Next, a conductive material, for example, Cu, Al, Pt, Au, and the like, is deposited on the first insulating dielectric layer 10 to form a first non-phase change material layer 20, and then a channel is formed passing through the first non-phase change material layer 20 with lithography and etching process, as shown in FIG. 1B.

Figure 1C:
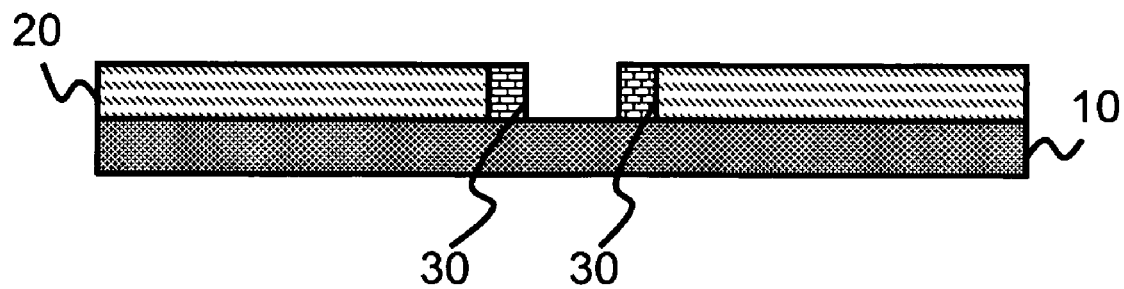

Next, a conductive material with higher resistivity, for example, Ti, W, TiN, TaN, TiW, TiAl, TiWN, TiAlN, Poly-Si, C, SiC, Ta, $TaSiO_x$, TaW, $TiAN_x$, GeN, TaO, and the like, is deposited on the surface of the channel of the first non-phase change material layer 20. An etching-back process is carried out through the conventional dry etching or wet etching, and the time of etching-back process is controlled, thus the second non-phase change material layer 30 with the same height as that of the first non-phase change material layer 20 and connected to both side walls of the channel of the first non-phase change material layer 20 is formed, as shown in FIG. 1C.

The above first non-phase change material 20 and the second non-phase change material 30 can be single layer or multiple layers of non-phase change materials. The principle for selecting the conductive material of the first non-phase change material layer 20 and that of the second non-phase change material layer 30 is that the resistivity of the conductive material of the second non-phase change material layer 30 is higher than that of the first non-phase change material layer 20.

Since the conductive material of the conventional phase change memory all has higher resistivity, a larger parasitic resistance will be generated in the conductive path. The phase change memory according to the present invention employs the first non-phase change material layer 20 with lower resistivity in combination with the second non-phase change material layer 30 with higher resistivity to act as the conductive material (also the same as the conventional conductive material), such that the parasitic resistance in the conductive path is reduced, so the additional power consumption of the phase change memory is reduced accordingly. Moreover, after the spacer of the second non-phase change material layer 30 is formed in the present invention, the subsequent sputtering deposition process of the phase change material can be provided with a relatively large arriving angle, such that the gap-filling ability of the phase change material can be enhanced, and the interface quality of the phase change material contacting with the second non-phase change material layer 30 can be improved.

Figure 1D:
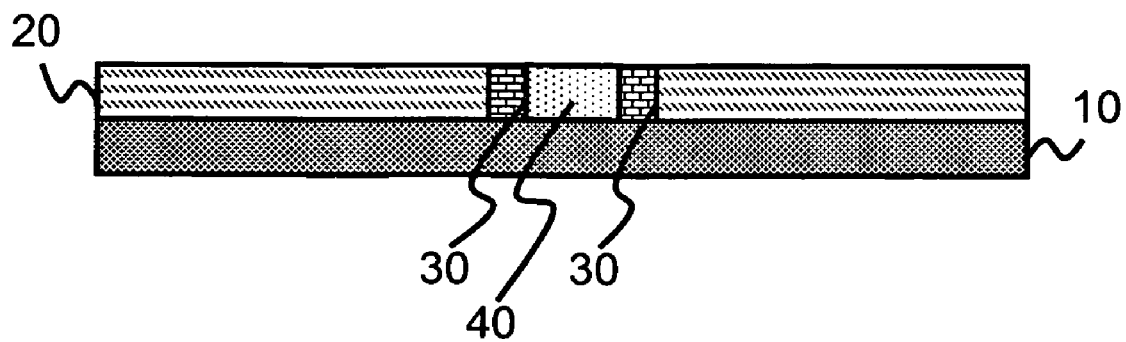

Next, the phase change material is deposited to cover the first non-phase change material layer 20, the second non-phase change material layer 30, and the channel of the first non-phase change material layer 20. Then, an etching-back process is carried out through the conventional dry etching or wet etching, and the time of the etching-back process is controlled, such that a phase change material layer 40 can be formed with the same height as that of the second non-phase change material layer 30, located between the second non-phase change material layer 30, as shown in FIG. 1D. Further, the phase change material layer 40 also can form as the above phase change material layer 40 through the Chemical Mechanical Polishing (CMP) technique.

The above phase change material includes the alloy with some elements of Group VI in the periodic table of the elements, such as, GaSb, InSb, InSe, $Sb_2Te_3$, GeTe, $Ge_2Sb_2Te_5$, InSbTe, GaSeTe, $SnSb_2Te_4$, InSbGe, AgInSbTe, (GeSn)SbTe, GeSb (SeTe), $Te_{81}Ge_{15}Sb_2S_2$ or other binary alloy, ternary alloy, and quaternary alloy.

As shown in FIG. 1C and FIG. 1D, the above second non-phase change material layer 30 is the added spacer electrodes, and the phase change material layer 40 is formed with the same height as that of the second non-phase change material layer and sandwiched there-between, such that the contact area of the electrodes and the volume of phase change material layer 40 can be reduced, thereby the programming current and power consumption of the phase change memory can be reduced.

Further, the size of the contact area for the conventional phase change memory is determined by the lithography process, while the phase change memory according to the present invention takes the second non-phase change material layer 30 (i.e., the spacer electrodes) as the heating electrodes, such that the size of the contact area with the phase change material layer 40 is not limited by the conventional lithography process.

Figure 1E:
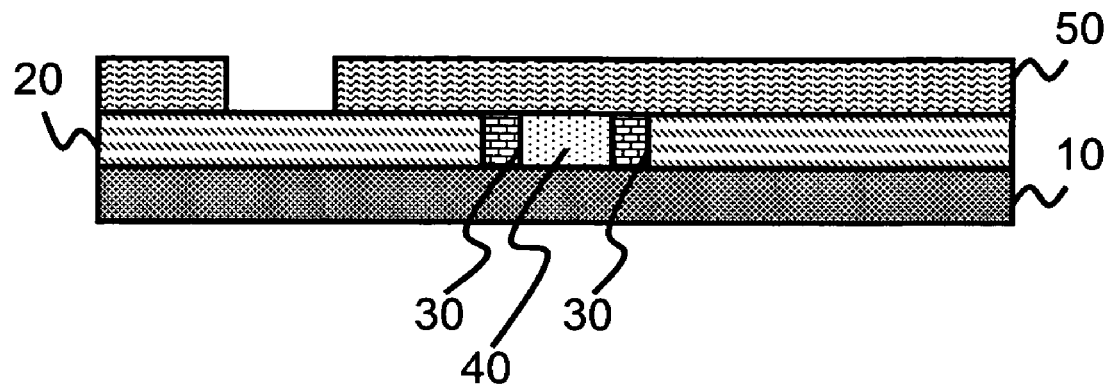

Then, a silicon oxide material is deposited on the first non-phase change material layer 20, the second non-phase change material layer 30, and the phase change material layer 40, to form a second insulating dielectric layer 50 with the silicon oxide material. And a channel is formed passing through the second insulating dielectric layer 50 with the lithography and etching process, as shown in FIG. 1E.

Figure 1F:
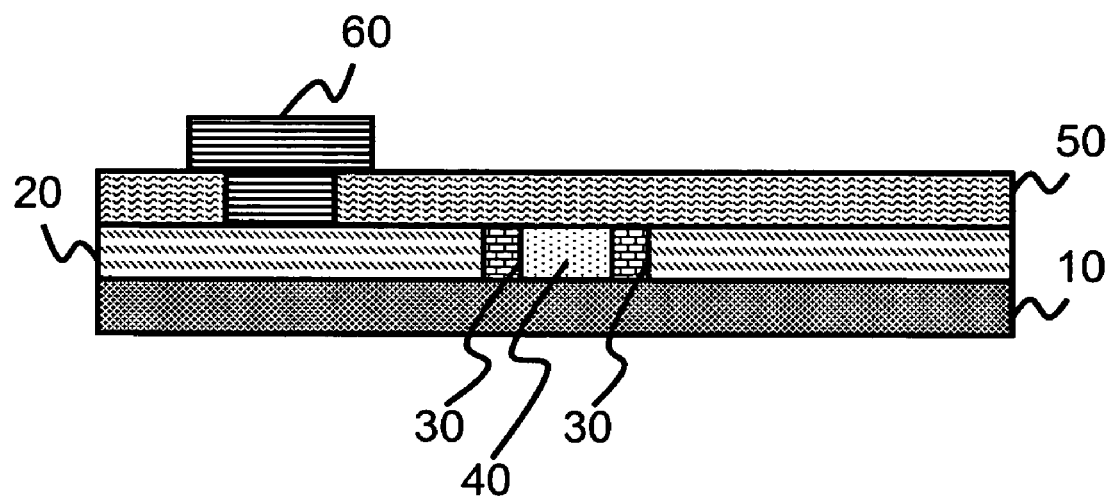

Finally, an electric plug 60 is formed in the channel of the second insulating dielectric layer 50 through the deposition, lithography, and etching process, to complete the lateral phase change memory with spacer electrodes provided in the present invention, as shown in FIG. 1F.

The electric plug 60 can be electrically contacted with a current driving circuit. And the material of the second insulating dielectric layer 50 can be the same as or different from that of the first insulating dielectric layer 10.

Therefore, the present invention is illustrated with the phase change memory, and illustrated with the phase change memory and the transistor (for example, MOSFET, BJT, and the like) on the same substrate.

Referring to FIG. 2A, FIG. 2B, FIG. 2C, FIG. 2D, FIG. 2E, FIG. 2F, FIG. 2G, FIG. 2H, and FIG. 2I, they are cross-sectional views of a lateral phase change memory with spacer electrodes and method of manufacturing the same according to a second embodiment of the present invention.

Figure 2A:
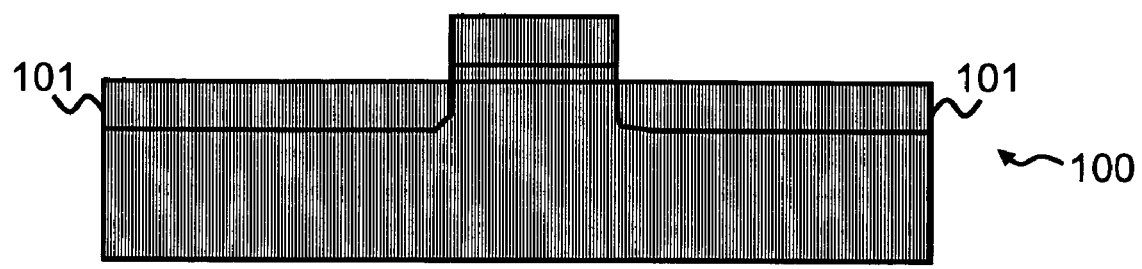
FIG. 2A, FIG. 2B, FIG. 2C, FIG. 2D, FIG. 2E, FIG. 2F, FIG. 2G, FIG. 2H, and FIG. 2I are cross-sectional views of a lateral phase change memory with spacer electrodes and method of manufacturing the same according to a second embodiment of the present invention.

First, as shown in FIG. 2A, a semiconductor element 100 is formed through IC processing technique. The semiconductor element 100 can be a Metal Oxide Semiconductor Field Effect Transistor (MOSFET) with a gate, a source, and a drain, or a Bipolar Junction Transistor (BJT) with a base, a collector, and an emitter. The second embodiment is illustrated with the phase change memory of the present invention and the MOSFET on the same substrate.

Figure 2B:
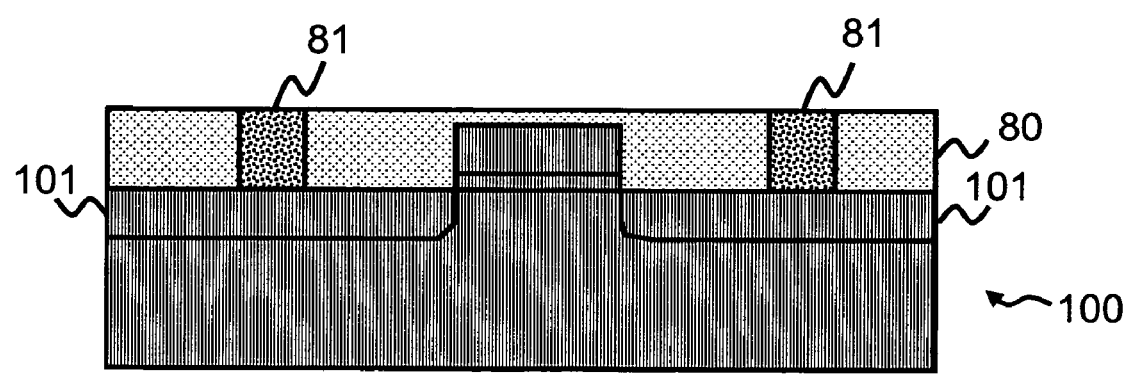

As shown in FIG. 2B, a dielectric, such as, silicon oxide or silicon nitride is deposited on the MOSFET through the conventional CVD or PVD process, to form an insulating dielectric layer. After the insulating dielectric layer 80 is formed, it is patterned and etched to form channels therein. Then, the channels of the insulating dielectric layer 80 are filled with (through a conventional deposition process) a conductive material, e.g., Cu, Al, Pt, Au, and the like, to form two first metallic plugs 81. The two first metallic plugs 81 are respectively electrically connected to the doped areas 101 in the MOSFET respectively, i.e., the drain and source of the MOSFET are formed.

Figure 2C:
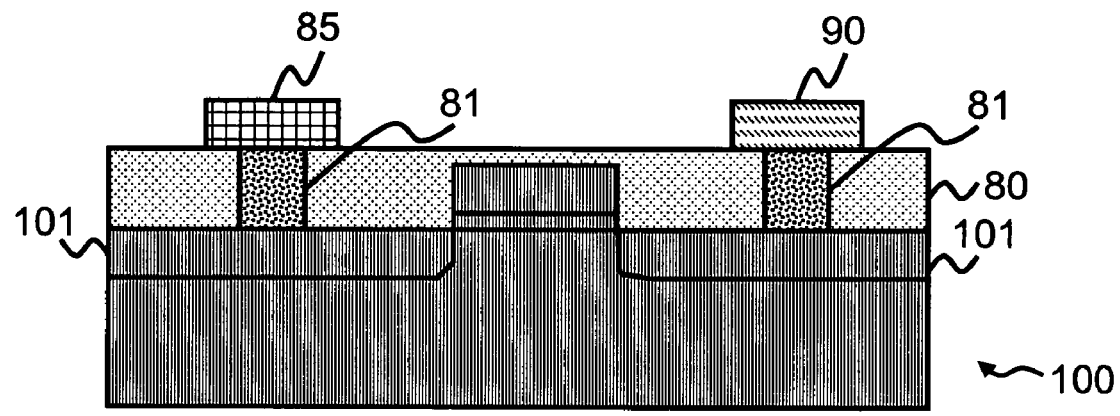

Next, as shown in FIG. 2C, a grounding pad 85 and an electric pad 90 are respectively formed on the first metallic plugs 81 of the insulating dielectric layer 80 again through the conventional deposition, lithography, and etching process, wherein the grounding pad 85 is formed on the source of the MOSFET, and the electric pad 90 is formed on the drain of the MOSFET.

Figure 2D:
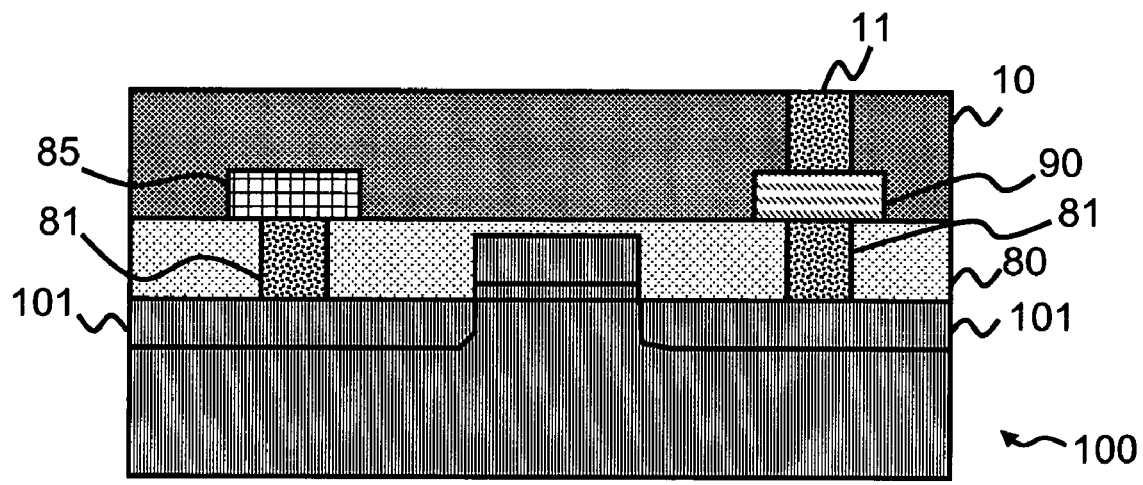

Thereafter, as shown in FIG. 2D, a dielectric, such as, silicon oxide or silicon nitride is deposited on the insulating dielectric layer 80, the grounding pad 85, and the electric pad 90, to form a first insulating dielectric layer 10. After being formed, the first insulating dielectric layer 10 at the position corresponding to the electric pad 90 is patterned and etched to form a channel, and the channel of the first insulating dielectric layer 10 is then filled with a conductive material, e.g., Cu, Al, Pt, Au, and the like, so as to form a second metallic plug 11 passing through the first insulating dielectric layer 10. In other words the second metallic plug 11 is disposed on the electric pad 90 opposite to the first metallic plug 81, and the second metallic plug 11 is in electrically contact with the electric pad 90.

Figure 2E:
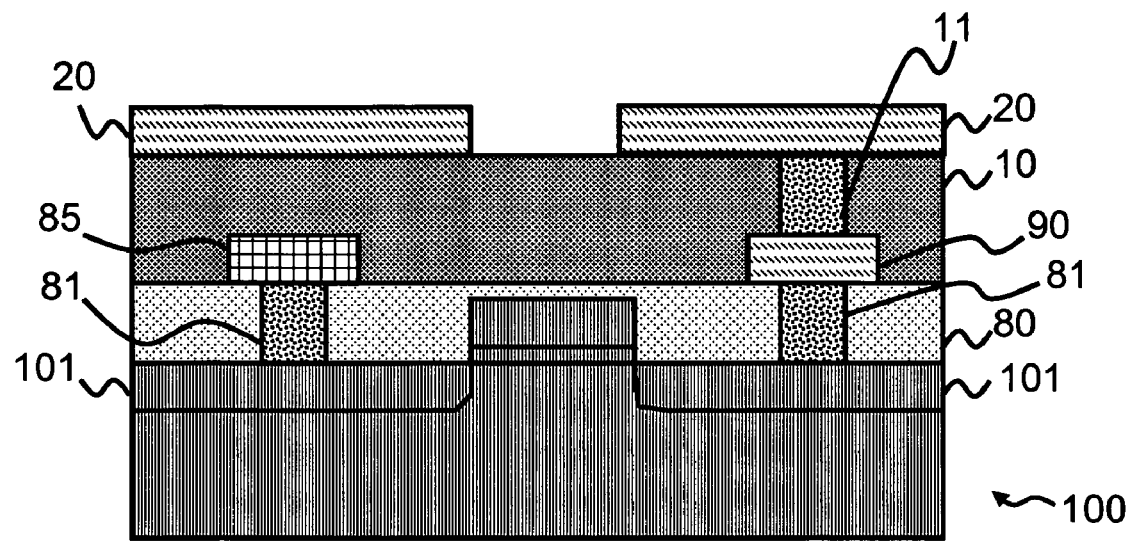

Then, as shown in FIG. 2E, a conductive material is further deposited on the first insulating dielectric layer 10, covering the second metallic plug 11 of the first insulating dielectric layer 10, to form a first non-phase change material layer 20. The conductive material is, for example, Cu, Al, Pt, Au, and the like. And a channel is formed passing through the first non-phase change material layer 20 with the lithography and etching process.

Figure 2F:
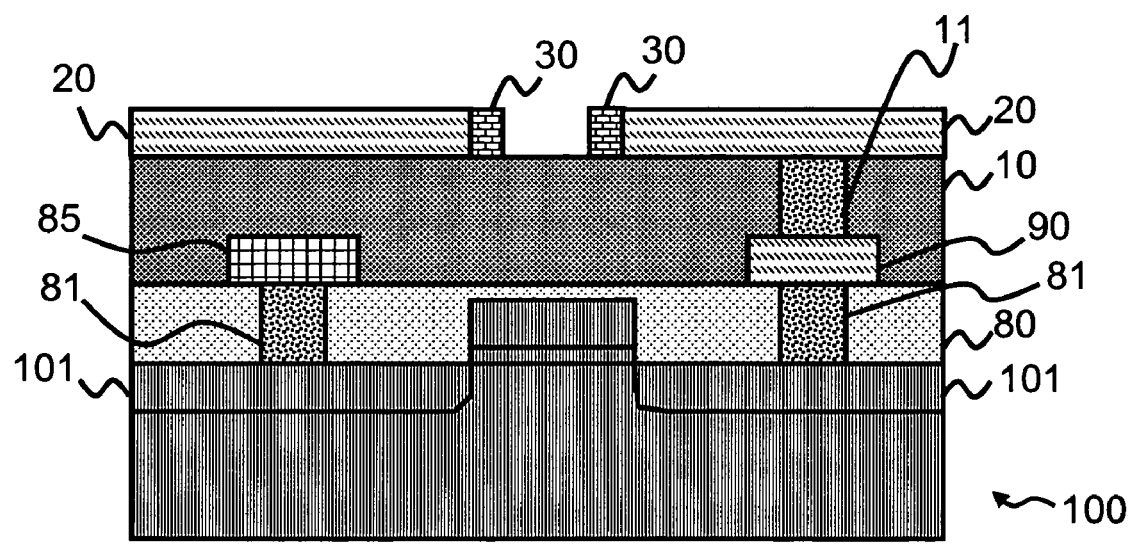

However, after FIG. 2E, the processing steps and methods are all the same as that of the first embodiment, for example, in FIG. 2F, the second non-phase change material layer 30, i.e., heating electrodes, with smaller contact area with the phase change material layer 40 is formed by depositing a conductive material with higher resistivity and then carrying out the etching-back process, the same as that of the FIG. 1C.

The material of the second non-phase change material layer 30 includes Ti, W, TiN, TaN, TiW, TiAl, TiWN, TiAlN, Poly-Si, C, SiC, Ta, $TaSiO_X$, TaW, $TiAN_X$, GeN, TaO, and the like.

Figure 2G:
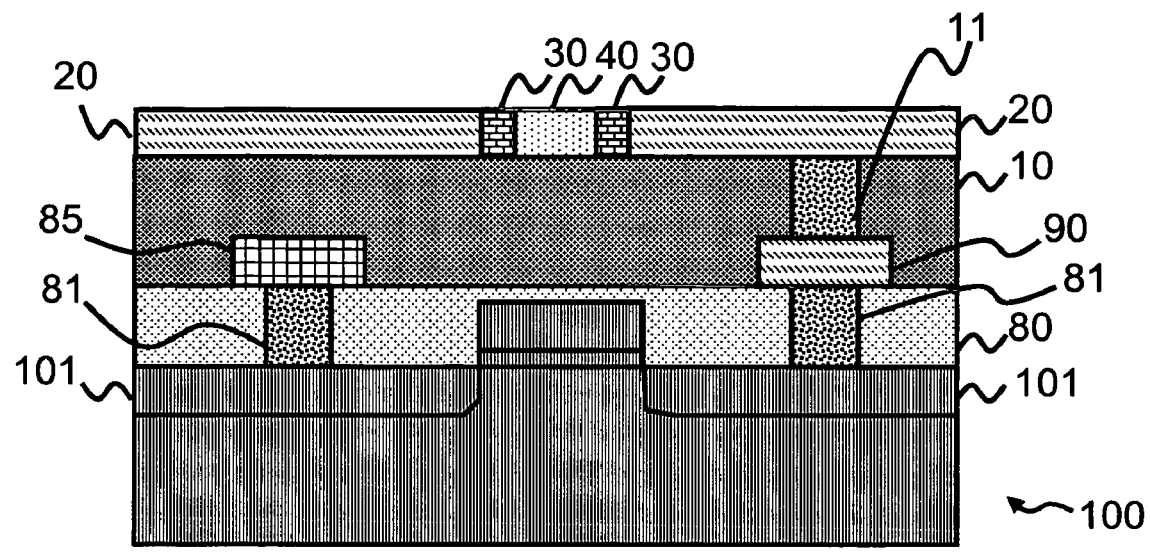

A phase change material is also deposited in FIG. 2G, corresponding to FIG. 1D, and a phase change material layer 40 is formed by carrying out the etching-back process through the conventional dry etching or wet etching, or through the Chemical Mechanical Polishing (CMP) method.

Figure 2H:
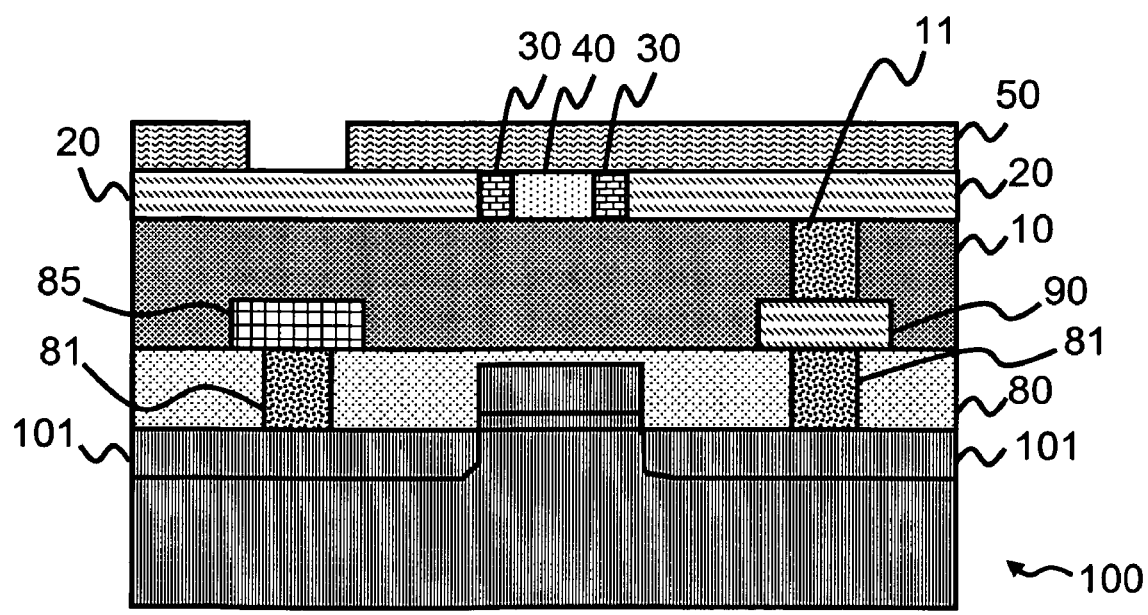
Figure 2I:
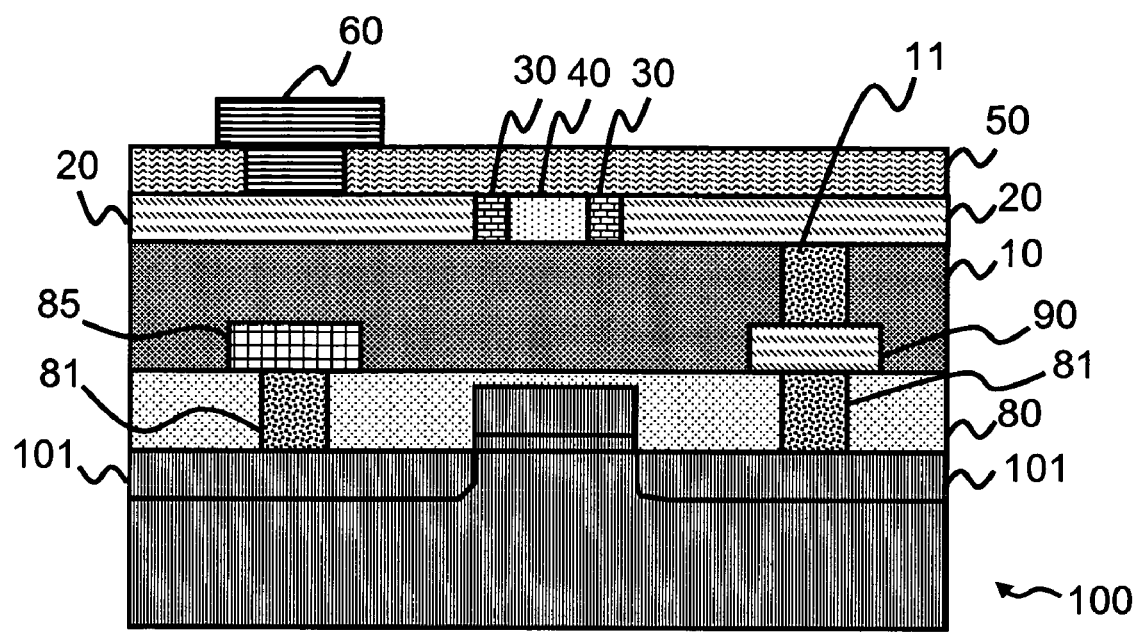

A second insulating dielectric layer 50 and a channel passing through the second insulating dielectric layer 50 are formed through deposition, lithography, and etching process in FIG. 2H, corresponding to FIG. 1E. An electric plug 60 is formed in the channel of the second insulating dielectric layer 50 in FIG. 2I, corresponding to FIG. 1F.

The above deposition process is not limited to the chemical vapor deposition (CVD) and physical vapor deposition (PVD); and the thermal evaporation, sputtering, low pressure chemical vapor deposition (LPCVD), plasma enhanced chemical vapor deposition (PECVD), atomic layer deposition (ALD), atomic layer chemical vapor deposition (ALCVD), and the like can also be used.

As for the fixed current, the smaller the contact area between the surface of the electrode and that of the phase change material layer 40 is, the more easily the phase change material can be heated, such that the phase change material layer 40 can carry out a phase change reaction, i.e., being converted form the crystalline state to the amorphous state. Therefore, in the lateral phase change memory with spacer electrodes of the present invention, the spacer electrodes, i.e., the second non-phase change material layer, are mainly added in the channel of the first non-phase change material layer; and the phase change material layer 40 is formed between the second non-phase change material layer, such that the contact area with the phase change material layer 40 is reduced. Therefore, the size of contact area of the phase change material layer 40 is not limited by the conventional lithography process.

In addition, the phase change memory according to the present invention employs the first non-phase change material layer 20 with lower resistivity in combination with the spacer electrodes with higher resistivity, such that the parasitic resistance in the conductive path can be reduced, and thereby the programming current and power consumption of the phase change memory can be reduced as well.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A lateral phase change memory with spacer electrodes, comprising:
    a first insulating dielectric layer;
    a first non-phase change material layer formed on the first insulating dielectric layer and having defined therein a first channel which passes through the first non-phase change material layer and which has side walls;
    a plurality of second non-phase change material layers formed respectively on the side walls of the first channel of the first non-phase change material layer and in electrical contact with the first non-phase change material layer, the plurality of second non-phase change material layers being disposed so that they do not contact one another, and each of the plurality of second non-phase change material layer having a resistivity which is higher than that of the first non-phase change material layer;
    a phase change material layer formed between the plurality of second non-phase change material layers and in electrical contact therewith, wherein the phase change material layer, the plurality of second non-phase change material layers, and the first non-phase change material layer are respectively in contact with the first insulating dielectric layer;
    a second insulating dielectric layer formed on the first non-phase change material layer, the plurality of second non-phase change material layers, and the phase change material layer, the second insulating dielectric layer having defined therein a second channel which passes through the second insulating dielectric layer and which is spaced apart from the first channel; and
    an electric plug formed in the second channel of the second insulating dielectric layer and in contact with the first non-phase change material layer.

2. The phase change memory as claimed in claim 1, wherein the first non-phase change material layer is comprised of a material which is selected from the group consisting of Cu, Al, Pt, and Au.

3. The phase change memory as claimed in claim 1, wherein the plurality of second non-phase change material layers is comprised of a material which is one of Ti, W, TiN, TaN, TiW, TiAI, TiWN, TiAIN, Poly-Si, C, SiC, Ta, TaSiO$_x$, TaW, TiAN$_x$, GeN, or TaO.

4. A lateral phase change memory with spacer electrodes, comprising:
    a semiconductor element;
    an insulating dielectric material layer formed on the semiconductor element and having defined therein a plurality of channels which pass through the insulating dielectric material layer and which each accommodates one of a plurality of first metallic plugs therein;
    a grounding pad and an electric pad respectively connected to the plurality of first metallic plugs;
    a first insulating dielectric layer formed on the insulating dielectric material layer, the grounding pad, and the electric pad, and having defined therein a channel which passes through the first insulating dielectric layer and which accommodates a second metallic plug which is connected to the electric pad;
    a first non-phase change material layer formed on the first insulating dielectric layer and having defined therein a first channel which passes through the first non-phase change material layer and which has side walls;
    a plurality of second non-phase change material layers formed respectively on the side walls of the first channel of the first non-phase change material layer and in electrical contact with the first non-phase change material layer, the plurality of second non-phase change material layers being disposed so that they do not contact one another, and each of the plurality of second non-phase change material layer having a resistivity which is higher than that of the first non-phase change material layer;
    a phase change material layer formed between the plurality of second non-phase change material layers and laterally in electrical contact therewith, wherein the phase change material layer, the plurality of second non-phase change material layers, and the first non-phase change material layer are respectively in contact with the first insulating dielectric layer;
    a second insulating dielectric layer formed on the first non-phase change material layer, the plurality of second non-phase change material layers, and the phase change material layer, the second insulating dielectric layer having defined therein a second channel which passes through the second insulating dielectric layer and which is spaced apart from the first channel and
    an electric plug formed in the second channel of the second insulating dielectric layer and in contact with the first non-phase change material layer.

5. The phase change memory as claimed in claim 4, wherein the semiconductor element is a Metal Oxide Semiconductor Field Effect Transistor (MOSFET).

6. The phase change memory as claimed in claim 4, wherein the semiconductor element is a Bipolar Junction Transistor (BJT).

7. The phase change memory as claimed in claim 4, wherein the first non-phase change material layer is comprised of a material which is selected from the group consisting of Cu, Al, Pt, and Au.

8. The phase change memory as claimed in claim 4, wherein the plurality of second non-phase change material layers is comprised of a material which is one of Ti, W, TiN, TaN, TiW, TiAI, TiWN, TiAIN, Poly-Si, C, SiC, Ta, TaSiO$_x$, TaW, TiAN$_x$, GeN, or TaO.

* * * * *